(12) United States Patent
Mahler et al.

(10) Patent No.: US 8,110,906 B2
(45) Date of Patent: Feb. 7, 2012

(54) SEMICONDUCTOR DEVICE INCLUDING ISOLATION LAYER

(75) Inventors: Joachim Mahler, Regensburg (DE); Wae Chet Yong, Melaka (MY); Stanley Job Doraisamy, Kuala Lumpur (MY); Gerhard Deml, Erding (DE); Rupert Fischer, MaxHuette-Haidhof (DE); Reimund Engl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 690 days.

(21) Appl. No.: 11/778,427

(22) Filed: Jul. 16, 2007

(65) Prior Publication Data

US 2008/0173992 A1    Jul. 24, 2008

Related U.S. Application Data

(63) Continuation-in-part of application No. 11/626,091, filed on Jan. 23, 2007.

(51) Int. Cl.
*H01L 21/00* (2006.01)
*H01L 23/02* (2006.01)
*H01L 23/495* (2006.01)

(52) U.S. Cl. ........ 257/676; 257/678; 257/685; 257/690; 257/702

(58) Field of Classification Search ............... 257/725, 257/E25.026, E25.029, 676, 678, 685, 690, 257/702
See application file for complete search history.

(56) References Cited

U.S. PATENT DOCUMENTS

| | | | |
|---|---|---|---|
| 4,173,664 A | 11/1979 | Cieloszyk | |
| 5,012,322 A * | 4/1991 | Guillotte et al. | 257/753 |
| 5,965,947 A * | 10/1999 | Nam et al. | 257/783 |
| 6,107,674 A | 8/2000 | Zommer | |
| 6,228,747 B1 | 5/2001 | Joyner | |
| 6,569,709 B2 | 5/2003 | Derderian | |
| 6,583,505 B2 | 6/2003 | Choi | |
| 6,593,210 B1 | 7/2003 | Rangarajan et al. | |
| 6,743,710 B2 | 6/2004 | Dunham et al. | |
| 6,756,689 B2 * | 6/2004 | Nam et al. | 257/783 |
| 6,844,623 B1 | 1/2005 | Peterson et al. | |
| 6,908,784 B1 * | 6/2005 | Farnworth et al. | 438/106 |
| 6,963,125 B2 | 11/2005 | Featherby et al. | |
| 7,060,526 B2 | 6/2006 | Farnworth et al. | |
| 7,262,511 B2 | 8/2007 | Osako et al. | |
| 7,303,942 B2 * | 12/2007 | Kuwabara et al. | 438/113 |
| 2002/0034625 A1 * | 3/2002 | Grill et al. | 428/304.4 |
| 2002/0125556 A1 * | 9/2002 | Oh et al. | 257/685 |
| 2005/0085008 A1 | 4/2005 | Derderian et al. | |
| 2005/0206010 A1 * | 9/2005 | Noquil et al. | 257/778 |
| 2005/0227415 A1 | 10/2005 | Farnworth et al. | |
| 2006/0263944 A1 | 11/2006 | Lange | |
| 2007/0001278 A1 | 1/2007 | Jeon et al. | |

FOREIGN PATENT DOCUMENTS

DE    10 2004 034 397    11/2006
WO    0248702 A2    6/2002

* cited by examiner

*Primary Examiner* — Angel Roman
(74) *Attorney, Agent, or Firm* — Dicke, Billig & Czaja, PLLC

(57) ABSTRACT

A semiconductor device includes a carrier, a semiconductor chip including an active area on a first face and a separate isolation layer applied to a second face, and an adhesion material coupling the isolation layer to the carrier with the second face facing the carrier.

14 Claims, 8 Drawing Sheets

SEMICONDUCTOR DEVICE INCLUDING ISOLATION LAYER

CROSS-REFERENCE TO RELATED APPLICATIONS

This Utility Patent application is a Continuation-in-Part Application of, and claims priority under 35 U.S.C. §120 to, U.S. patent application Ser. No. 11/626,091 entitled GAS PHASE PRECIPITATED POLYMERS AS HIGHLY INSULATING CHIP BACKSIDE LAYER, filed Jan. 23, 2007, which is incorporated herein by reference in its entirety.

BACKGROUND

The invention relates to semiconductor wafers having a multiplicity of semiconductor component positions arranged in rows and columns. It furthermore relates to a power semiconductor module having a power semiconductor chip and a logic semiconductor chip and also a method for producing semiconductor chips.

Semiconductor chips which are arranged as logic semiconductor chips together with a power semiconductor chip on an electrically conductive substrate such as a leadframe, for example, have to be electrically insulated from the substrate. An electrically insulating adhesive is usually used for this purpose, by means of which the semiconductor chip is adhesively bonded by its rear side onto the substrate.

What is disadvantageous in this case is that the electrical insulation capability of adhesives is very limited, particularly if they are intended to have good thermal conduction properties. Moreover, even slight tilting of the semiconductor chip can result in an electrical contact being produced between the chip rear side and the substrate. The use of an adhesive layer as electrical insulation therefore requires great precision during the application of the semiconductor chip.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
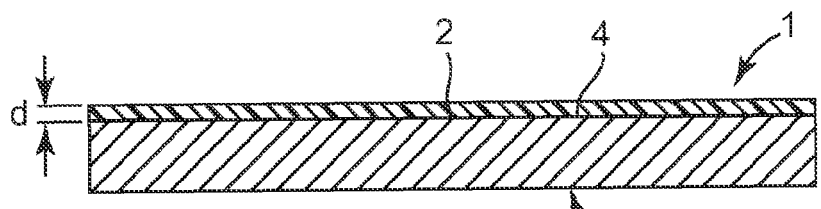
FIG. 1 schematically shows a cross section through a semiconductor wafer in accordance with one embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In accordance with one exemplary embodiment of the invention, a method for producing semiconductor chips includes the following steps: a semiconductor wafer having semiconductor chip positions arranged in rows and columns is provided, wherein the semiconductor wafer has on its front side front sides of semiconductor chips with integrated circuits. The rear side of the semiconductor chip is covered and coated with a coating having Parylene. The semiconductor wafer is subsequently singulated into semiconductor chips on whose rear sides the coating having Parylene is arranged.

In an alternative embodiment of the method, the semiconductor wafer provided is first applied to a sawing film and singulated into semiconductor chips and the rear sides of the singulated semiconductor chips are subsequently coated with the coating having Parylene. The coated semiconductor chips can then be removed from the sawing film.

In this embodiment of the method, in addition to the rear sides of the semiconductor chips, their edge sides can also be provided with the coating having Parylene, with the result that the breakdown strength of the semiconductor chips is additionally increased.

For this purpose, the sawing film is advantageously extended prior to coating, with the result that interspaces are formed between the semiconductor chips and the edge sides of the semiconductor chips are uncovered. If the interspaces that arise during sawing as a result of the material removal are wide enough, it is not necessary for the sawing film to be extended.

It is a consideration that the electrical insulation of the semiconductor chip can be achieved in a particularly simple manner by providing the rear side of the semiconductor chip with an electrical insulation layer simultaneously in the course of its production. This precludes the situation where tilting of the semiconductor chip during its mounting leads to the production of an electrical contact with the substrate. Consequently, particular precision during the application of the semiconductor chip to the substrate is not necessary since the electrical insulation is still present even with a tilted chip.

At least the following conditions should be met for a particularly good electrical insulation of the chip rear side: firstly, the material used for insulation should have a particularly high breakdown strength. Secondly, it should be able to be applied to the rear side of the semiconductor chip with a constant thickness in a simple technical process. Moreover, a high temperature resistance of the insulation material is desirable.

Parylenes meet these conditions and are therefore particularly well suited as insulation materials. They have a high electrical insulation strength; by way of example, a layer having a thickness of 1 µm has an electrical breakdown strength of 500 V. In addition, Parylene takes up only very little moisture and is comparatively elastic, so that it can buffer thermomechanical stresses between semiconductor chip and substrate. In addition, Parylenes often have low coefficients of thermal expansion of less than 50 ppm/K, a high thermal stability and a high chemical resistance.

If the coating is applied prior to the sawing process for separating the semiconductor wafer, it protects the wafer during the sawing process and prevents semiconductor material from breaking off at the edges, so-called chipping. Consequently, the coating also constitutes a mechanical protection layer for the semiconductor wafer or the semiconductor chips. What is more, on account of its insulation properties, it can serve as an ESD (electrostatic discharge) protection layer and prevent electrostatic discharges of the semiconductor wafer and of the semiconductor chips during processing.

The coating is advantageously carried out by means of gas phase polymerization, with the following steps: firstly, the dimer of the compound is evaporated. The dimer is prepared for example by dehydrating pyrolytic dimerization of p-xylene and subsequent quenching in liquid p-xylene. This yields [2,2]-p-cyclophane. During the subsequent pyrolysis of the dimer, the dimer cleaves into two divalent free-radical monomers such as p-xylene. Upon the deposition of the monomers present in the gas phase on the surfaces to be coated, the polymerization takes place upon cooling.

A very pure Parylene coating can be deposited by means of this process. Consequently, apart from unavoidable contaminants, the coating can be composed completely or almost completely of Parylene.

The evaporation is advantageously carried out at a temperature of 160° C. to 180° C. and a pressure of 1-2 mbar.

The pyrolysis is advantageously carried out at a temperature of 660° C. to 690° C. and a pressure of 0.5-1 mbar.

The polymerization is advantageously carried out at a temperature of less than 35° C. and a pressure of 0.1-0.2 mbar.

In one exemplary embodiment, prior to the application of the coating having Parylene, at least one metal layer is applied to the rear side of the semiconductor wafer or of the semiconductor chips. In this case, the metal layers may have aluminum and/or titanium and/or nickel.

In accordance with further aspects of the present invention, an exemplary semiconductor power module has the following features: a power substrate, at least one power semiconductor chip arranged on the power substrate and at least one logic semiconductor or driver chip having an active front side, which logic semiconductor chip is mounted by its rear side onto the power substrate, wherein the logic semiconductor chip has a coating having Parylene on its rear side.

The semiconductor component has the advantage that the rear side of the logic semiconductor chip is electrically insulated particularly well by the coating having Parylene. In addition, the insulation is intrinsic, that is to say that the coating is part of the chip rear side and, consequently, is not dependent on the type of mounting or jeopardized by tilting of the semiconductor chip.

The coating having Parylene advantageously has a layer thickness d where 500 nm≦d≦5 µm.

Parylene C, Parylene N or Parylene D may be provided for the coating having Parylene. In this case, it is expedient to choose that polymer whose properties best correspond to the requirements. Therefore, Parylene C has a melting point of 290° C. and is highly resistant to water and chemicals. Parylene N has a melting point of 420° C. and a particularly high dielectric breakdown strength of 7 kV/mm. Parylene D has a melting point of 380° C. and maintains its strength and its electrical properties even at high temperatures.

A leadframe is typically provided as the power substrate. However, other substrates are also conceivable.

In one exemplary embodiment, the logic semiconductor chip also has the coating having Parylene on its lateral areas. By virtue of the application of the coating not only on the chip rear sides but also on the edge sides or at least on parts of the edge sides such as, for example, a lower section of the edge sides, the logic semiconductor chip is electrically insulated from the substrate particularly well. Even tilting of the semiconductor chip during application to the substrate does not lead to the production of an electrical contact.

In one exemplary embodiment, at least one metal layer is arranged between the rear side of the logic semiconductor chip and the coating having Parylene, which metal layer may have for example aluminum and/or titanium and/or nickel.

The logic semiconductor chip is advantageously connected by its rear side, which is provided with the coating having Parylene, to the power substrate by means of an adhesive layer. The logic semiconductor chip can be connected particularly simply and permanently to the substrate by means of adhesive bonding. For a better thermal conductivity, the adhesive layer may have electrically conductive particles.

The method is particularly well suited to the application of an insulating coating to the rear side of the semiconductor chip as early as at the wafer level. A semiconductor wafer for having a multiplicity of semiconductor chip positions arranged in rows and columns has on its front side front sides of semiconductor chips with integrated circuits. A coating having Parylene is arranged on the rear side of the semiconductor wafer.

One or a plurality of metal layers between the rear side of the semiconductor wafer and the coating having Parylene may also be applied as early as at the wafer level and have for example aluminum and/or titanium and/or nickel.

The semiconductor wafer 1 in accordance with FIG. 1 has a front side 3 and a rear side 4. Front sides (not shown) of semiconductor chips with integrated circuits are arranged on the front side 3. The rear side 4 is passive; it has no integrated circuits.

A coating 2 having Parylene is arranged on the rear side 4 of the semiconductor wafer 1. In this exemplary embodiment, the coating is composed of Parylene apart from production-dictated contaminants and has a thickness d for which 500 nm$\leq$d$\leq$5 μm holds true. The coating 2 is electrically insulating and has a sufficient breakdown strength even at high voltages in the range of hundreds of volts or a few kilovolts.

Figure 2:
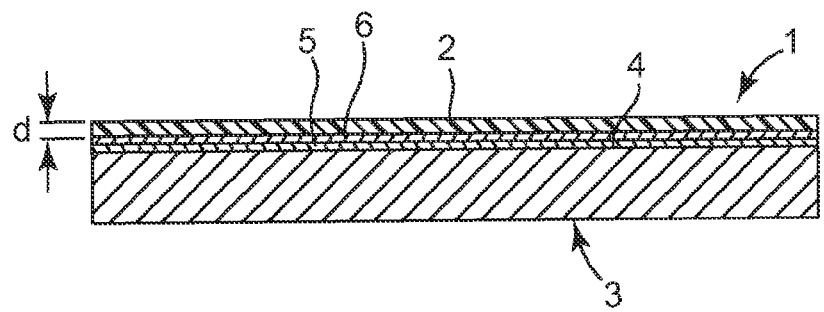
FIG. 2 schematically shows a cross section through an alternative embodiment of the semiconductor wafer in accordance with one embodiment of the invention.

FIG. 2 shows an alternative embodiment of the wafer 1. In this embodiment, a metal layer 5 and a further metal layer 6 are arranged between the rear side 4 of the wafer 1 and the coating 2.

In order to produce the coating 2, this exemplary embodiment employs gas phase polymerization, by means of which particularly pure and uniform coatings can be produced in a comparatively simple manner. For this purpose, the semiconductor wafer 1 is introduced into a vacuum chamber in such a way that its front side 3, which has the integrated circuits, is covered, whereas its rear side 4 to be coated or the surfaces of metal layers 5 and 6 arranged on the rear side 4 are uncovered.

Figure 3:
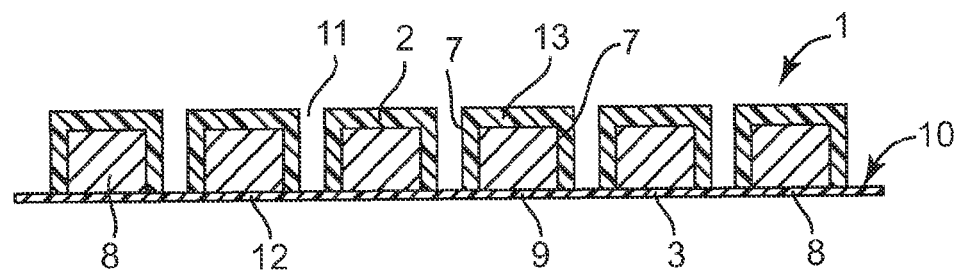
FIG. 3 schematically shows a cross section through the semiconductor wafer separated into semiconductor chips in accordance with one embodiment of the invention and FIG. 4 schematically shows a detail from a power semiconductor module in accordance with one embodiment of the invention.

After the coating, the semiconductor wafer 1 is singulated into semiconductor chips. As an alternative, however, it is also possible for the edge sides of the semiconductor chips to be coated as well in addition to the rear side 4 of the semiconductor wafer 1. This is illustrated in FIG. 3.

For this purpose, the semiconductor wafer 1 is applied by its front side 3 onto the top side 10 of a sawing film 9 and singulated into semiconductor chips 8. The separation of the semiconductor wafer 1 into semiconductor chips 8 gives rise to interspaces 11 between the semiconductor chips 8, the sawing tracks. Consequently, the edge sides 7 of the semiconductor chips 8 are uncovered.

The semiconductor wafer 1 singulated into semiconductor chips 8 can then be provided with the coating 2. In this case, the semiconductor chips 8 remain with their front sides 12 on the top side 10 of the sawing film 9. The front sides 12 of the semiconductor chips 8 are therefore protected and are kept free of the coating 2.

During the gas phase polymerization, virtually all the uncovered surfaces are coated in the vacuum chamber. Consequently, in this exemplary embodiment, the uncovered edge sides 7 are also provided with the coating 2. Since the Parylene is present at least as a monomer initially in the gas phase, it can readily penetrate into the interspaces 11 and deposits on the edge sides 7 in principle with the same thickness d as on the rear sides 13 of the semiconductor chips 8.

If the interspaces 11 are still not large enough after the separation of the semiconductor wafer 1 into semiconductor chips 8, the sawing film 9 can be extended in order to enlarge them.

After the coating of the semiconductor chips, the latter can be removed from the sawing film 9. They then have a coating 2 both on their rear side 13 and on their edge sides 7 and are therefore electrically insulated particularly well.

Figure 4:
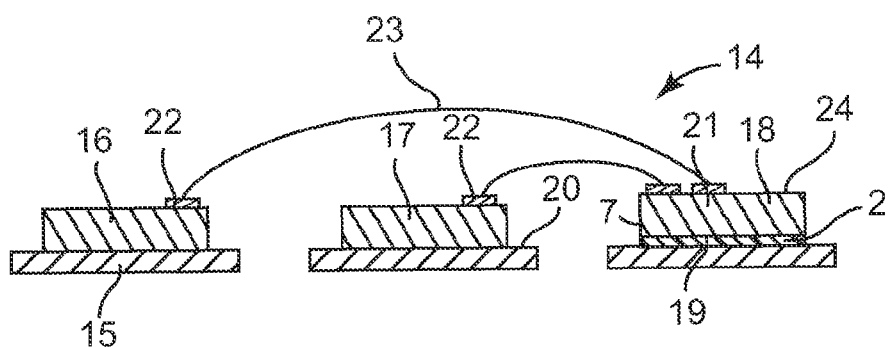

The power semiconductor module 14 in accordance with FIG. 4 is only shown schematically in a detail. The power semiconductor module may have for example a bridge or half-bridge circuit with power semiconductor chips. Details of the circuit are not of interest here and are therefore not illustrated. In the exemplary embodiment shown, a first power transistor 16 and a second power transistor 17 are arranged on a power substrate 15. A driver chip 18, which is likewise arranged on the power substrate 15, is provided for the driving of the power transistors.

The driver chip 18 has on its front side 24 contact areas 21 connected to the gate terminals 22 of the power transistors via connecting elements 23 such as bonding wires.

The driver chip 18 has to be electrically insulated from the power substrate 15. For this purpose, it has a Parylene coating 2 on its rear side 19. The driver chip 18 can be fixed on the power substrate 15 for example by means of an adhesive layer (not shown). In this exemplary embodiment, the Parylene coating 2 is only applied to the rear side 19 of the driver chip 18. However, it may additionally also be arranged on the edge sides 7 of said chip.

Other embodiments of semiconductor devices including a chip that is electrically isolated from a carrier to which the chip is attached are described below. Methods of isolating the chip from the carrier and other chips are also described below. In general, an electrically isolating insulation layer is deposited at the wafer level prior to singulating chips from the wafer. Applying the isolation layer at the wafer level configures chips singulated from the wafer for use in high voltage potential settings (e.g., of about 1000 volts), and provides a cost savings compared to applying the insulation layer on each chip individually. Embodiments described below provide electrically isolated semiconductor chips that are configured for use in high voltage potential settings by including an electrical breakthrough strength for the isolated chips of between about 225-300 volts/micrometer.

Conventionally, semiconductor chips are adhered to a carrier by adhesive or other bonding means, where the adhesive is selected to have electrical insulating properties. Adhesive is unreliable as an electrical insulator because as bubbles in the adhesive, or other contaminants in the adhesive, can reduce the electrical insulation between the chip and the carrier. In addition, when the semiconductor devices exposed to humid environmental conditions at elevated temperatures, the breakthrough strength of the adhesive insulator is significantly decreased. This is undesirable for electrically isolating a control chip from a power chip attached to the carrier, for example. The efficient processing of semiconductor devices benefits from the use of bonding layers having a minimum thickness and high accuracy of attachment and positioning. Adhesives and/or epoxies provide less than desirable bond thickness and less than desirable processing accuracy.

Various embodiments provide an insulation layer that is more reliable as an electrical isolator in that the insulation layer is fabricated without micro-bubbles associated with adhesive layers and glues. The insulating layer applied to the semiconductor wafer resides on each semiconductor chip after singulation, and is configured to electrically isolate the attached chip from other high voltage components attached to the carrier.

Figure 5:
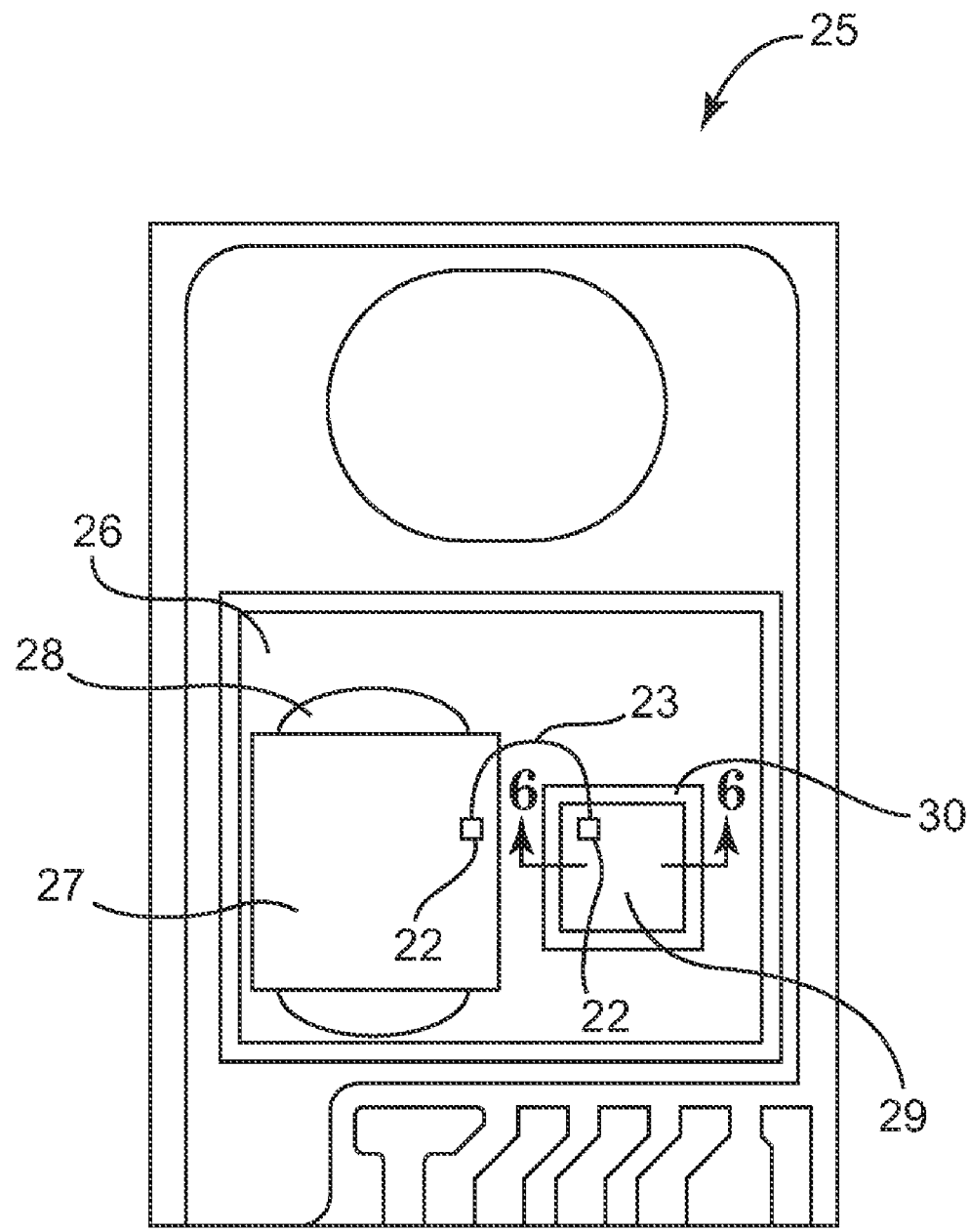
FIG. 5 is a top view of a die package according to one embodiment.

FIG. 5 is a top view of a die package 25 according to one embodiment. Die package 25 includes a carrier 26, a first chip 27 conductively bonded to carrier 26 by a conductive material 28, and a second chip 29 attached to carrier 26 by an adhesion layer 30, where second chip 29 is electrically isolated from both the carrier 26 and first chip 27. In one embodiment, die package 25 is a chip-by-chip die package and includes connector 23 (similar to FIG. 4) extending between bond pads 22 of chip 27 and chip 29.

Carrier 26 includes die pads, frames including copper metal conductive materials, leadframes, leadless package frames, thin small leadless package (TSLP) and other suitable package interposers. Suitable leadframes include quad flat, a dual small outline, and a thin shrink small outline package leadframes.

In one embodiment, first chip 27 is a vertical high voltage and power transistor chip having a source/gate on a front side, and a drain on a back side. The back side is electrically connected to carrier 26 by conductive material 28 that includes a conductive solder, a conductive epoxy, and/or conductive metal pastes including silver pastes and the like. In one embodiment, first chip 27 is a metal oxide semiconductor field effect transistor (MOSFET) power chip and has the same electrical potential as carrier 26. Carrier 26 and first chip 27 can be maintained in a high voltage configuration having a voltage potential of about 1,000 volts.

In one embodiment, second chip 29 is a control chip that is electrically isolated from carrier 26 and first chip 27. In this regard, second chip 29 has a voltage potential of up to 1,000 volts relative to carrier 26 and first chip 27. Adhesion layer 30 couples second chip 29 to carrier 26. Embodiments described below provide for electrically isolating second chip 29 from carrier 26 and first chip 27 even in cases where adhesion layer 30 is deformed and/or includes air bubbles (and is thus a poor electrical insulator). That is to say, second chip 29 is electrically isolated from carrier 26 independent from any isolation provided by adhesion layer 30.

Figure 6:
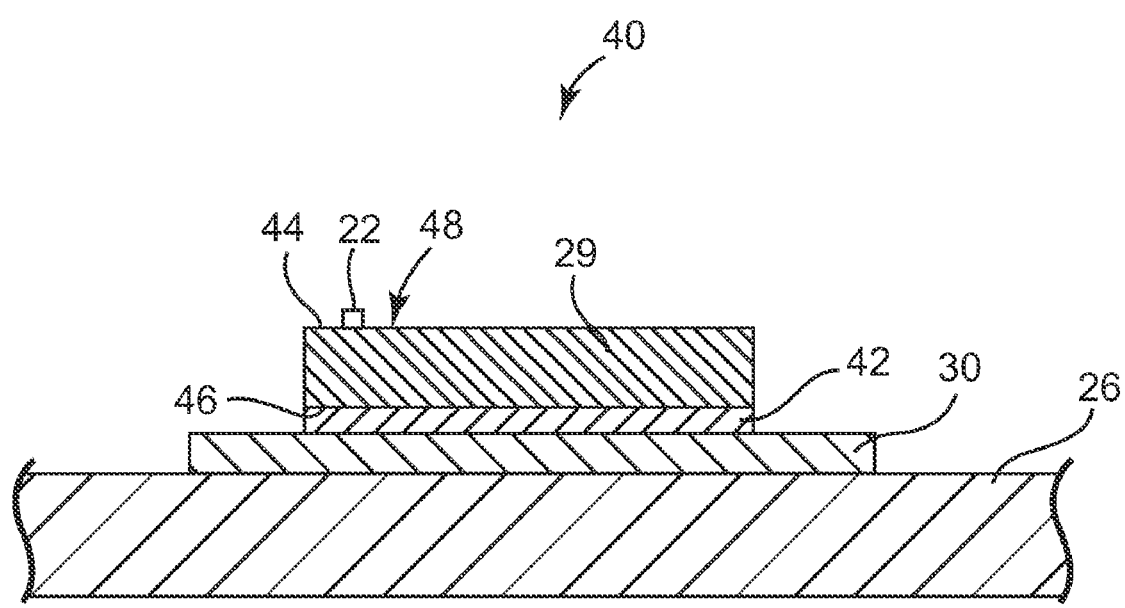
FIG. 6 is a cross-sectional view of a semiconductor device taken along the line 6-6 of the die package illustrated in FIG. 5.

FIG. 6 is a cross-sectional view of a semiconductor device 40 taken along line 6-6 of FIG. 5. In one embodiment, semiconductor device 40 is an integrated circuit and includes chip 29 electrically isolated from carrier 26 by an insulating layer 42. In one embodiment, chip 29 includes a first face 44 opposite a second face 46, where first face 44 defines an active area 48 and second face 46 defines a substrate surface (or passive surface). Second face 46, or substrate surface, is analogous to a base surface of a wafer onto which chip 29 is fabricated. Isolation layer 42 is coupled to second face 46 of chip 29, and adhesion layer 30 couples chip 29 to carrier 26.

Adhesion layer 30 includes electrically insulating tapes, electrically insulating glues, epoxies, and other suitable electrical isolation materials for attaching a semiconductor chip to a carrier. In one embodiment, adhesion layer 30 is applied to carrier 26 and defines a target area onto which chip 29 (having insulating layer 42 bonded to chip 29) is attached.

In one embodiment, insulating layer 42 is an electrical isolation layer such as Parylene (including Parylene C, Parylene N or Parylene D as described above), an oxide layer, a silicon dioxide layer, a nitride layer, borosilicate glass layer or other suitable electrically insulating material.

Figure 7:
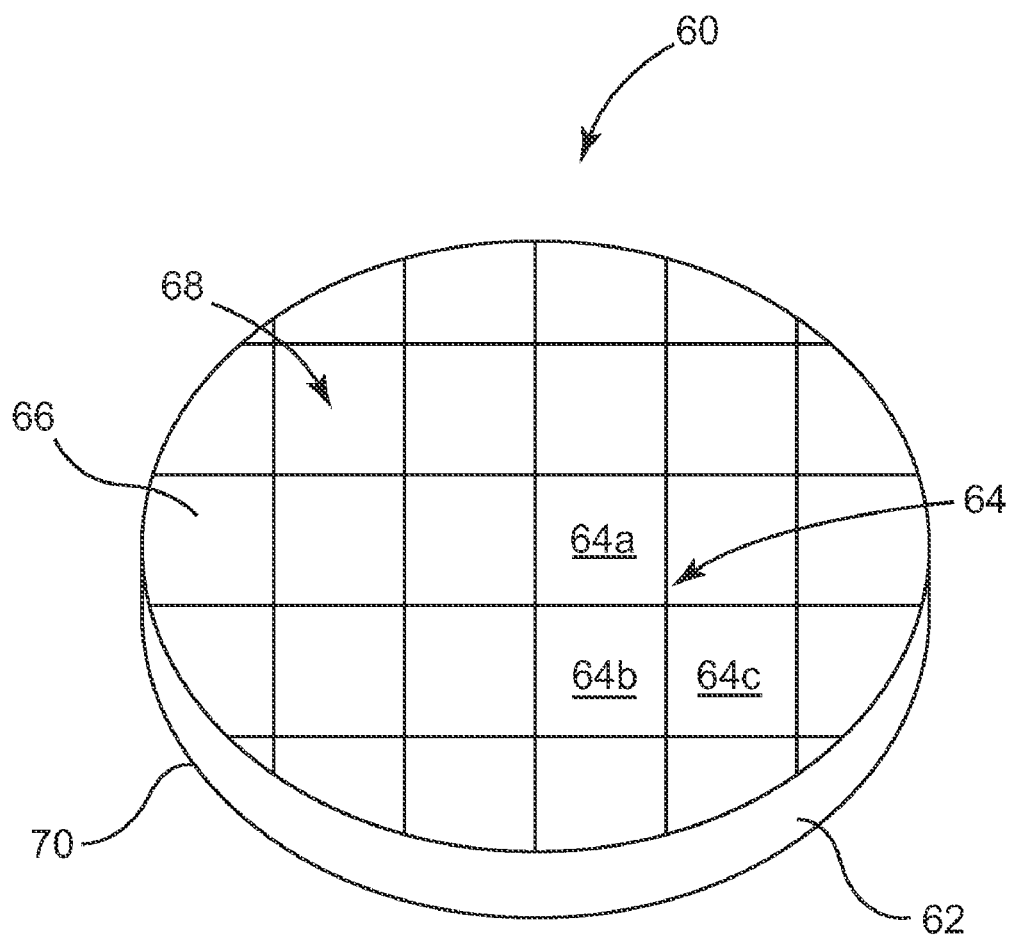
FIG. 7 is a perspective view of a semiconductor wafer including an active surface according to one embodiment.

FIG. 7 is a perspective view of a semiconductor wafer 60 according to one embodiment. Semiconductor wafer 60 includes a wafer substrate 62 onto which a plurality of semiconductor chips 64 are fabricated. Semiconductor wafer 60 provides a first surface 66 that defines an active area 68, and a second surface 70 generally opposite first surface 66. Semiconductor chips 64 include chip 64a, chip 64b, and chip 64c fabricated on substrate 62. Each chip 64a, 64b, and 64c is configured to be separated from wafer 60 and define an active component surface substantially coplanar with active area 68.

Figure 8A:
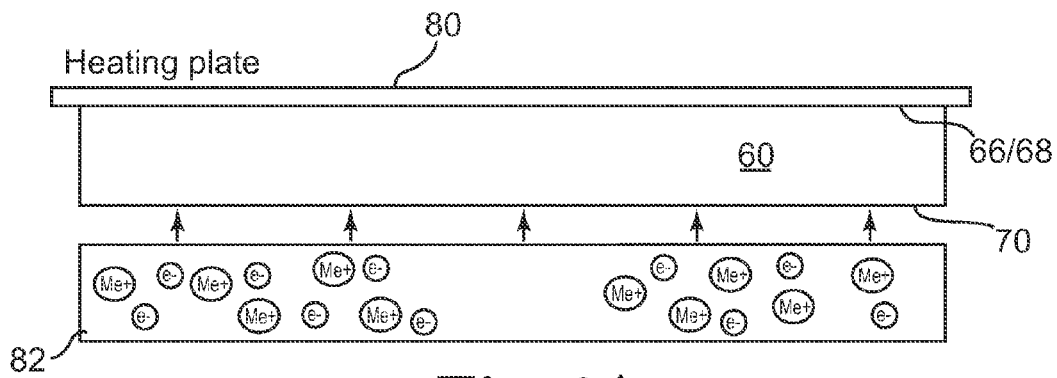
FIG. 8A is a side view of a heating plate contacting the active surface of the semiconductor wafer of FIG. 7.

FIG. 8A is a side view of a heating plate 80 contacting the active area 68 of semiconductor wafer 60. In one embodiment, heating plate (or heater) 80 is employed to maintain semiconductor wafer 60 at a temperature of between about 200-400 degrees Celsius in preparation for bonding an electrical isolator layer 82, such as an anodic bonded glass wafer, to a backside (i.e., second surface 70) of semiconductor wafer 60. In one embodiment, electrical isolator layer 82 includes a metal ion containing layer/wafer 82 attachable to second surface 70 of semiconductor wafer 60. In another embodiment, electrical isolator layer 82 includes an anodic bonded glass wafer 82 attachable to second surface 70 of semiconductor wafer 60.

Figure 8B:
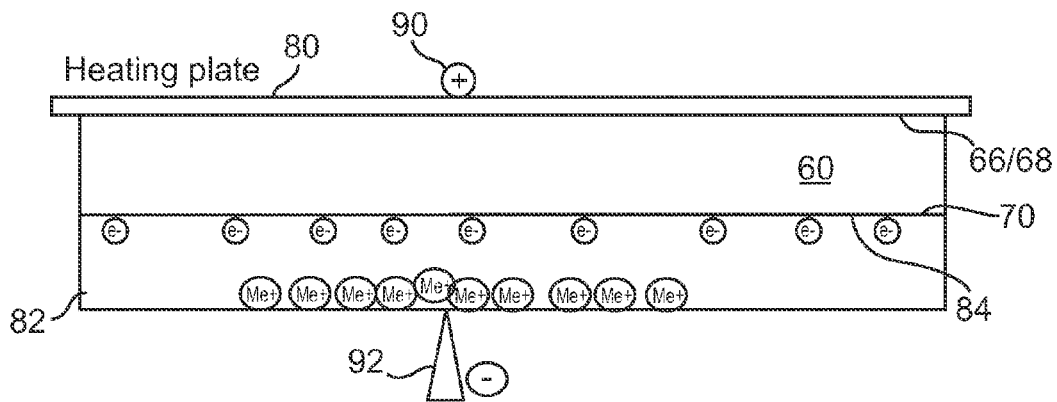
FIG. 8B is a side view of a cathode applied to the heating plate of FIG. 8A and an anode applied to an insulating layer that has been brought into contact with a substrate surface of the semiconductor wafer.

FIG. 8B is a side view of wafer 82 in contact with second surface 70 of semiconductor wafer 60 along an interface 84. In one embodiment, a high voltage cathode 90 is coupled to heater 80, and an anode 92 contacts a surface of layer/wafer 82. The charges in the metal ion-containing wafer 80 segregate in response to the voltage potential, drawing the negative ions e– attracted to cathode 90 to interface 84, and drawing the positive metal ions Me+ toward the surface adjacent anode 92. In this manner, semiconductor wafer 60 and layer/wafer 82 are anodic bonded along interface 84 at the elevated temperature provided by heater 80 and at a voltage potential defined between cathode 90 and anode 92.

Figure 8C:
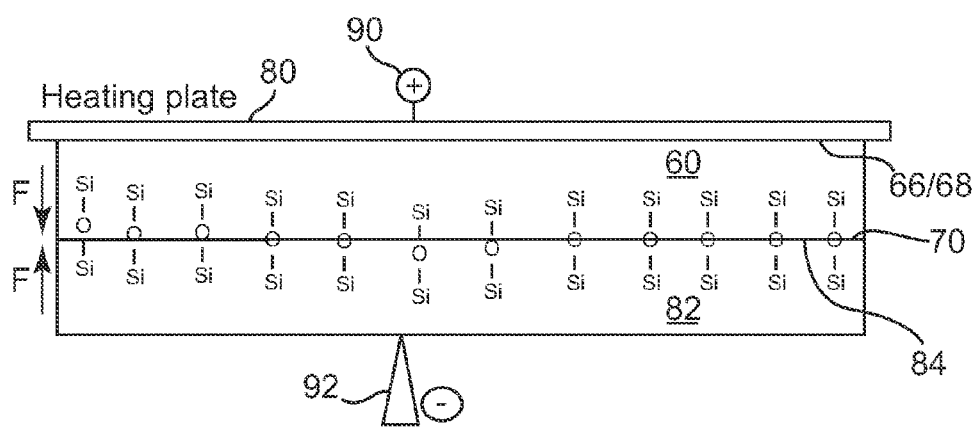
FIG. 8C is a side view of the insulating layer shown in FIG. 8B anodic bonded to the substrate surface of the semiconductor wafer according to one embodiment.

FIG. 8C is a side view of layer/wafer 82 bonded to semiconductor wafer 60 according to one embodiment. In one embodiment, semiconductor wafer 60 is anodic bonded to electrical isolator layer/wafer 82 and includes Si—O—Si bonds formed at interface 84. Layer/wafer 82 includes insulating material such as silicon dioxide, nitride, borosilicate glass, silica in general, and other suitable isolation materials. In this manner, semiconductor wafer 60 is electrically insulated on the wafer level, as is each individual chip 64 fabricated on wafer 60.

Figure 9:
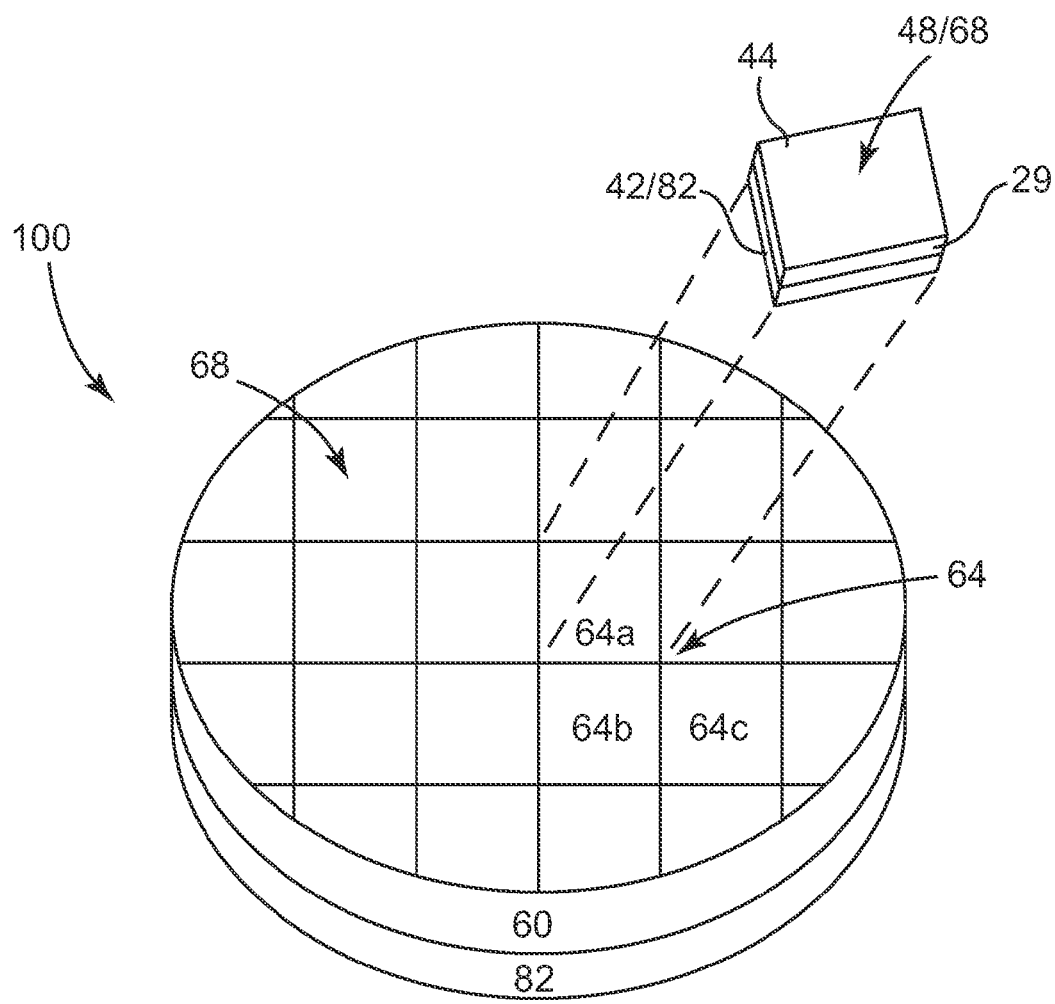
FIG. 9 is a perspective view of the semiconductor wafer shown in FIG. 7 including an insulating layer coupled to the semiconductor wafer opposite of the active surface according to one embodiment.

FIG. 9 is a perspective view of an insulated semiconductor wafer 100 according to one embodiment. Insulated semiconductor wafer 100 includes semiconductor wafer 60 and electrical isolator layer 82 bonded to a backside of semiconductor wafer 60. Active area 68 of semiconductor chips 64 are facing up relative to the orientation of FIG. 9. Insulated semiconductor wafer 100 is illustrated in its fabricated form ready for singulation. During singulation, individual insulated semiconductor chips are cut (or sawn as described above in FIG. 3) from insulated wafer 100. With additional reference to FIGS. 6 and 7, semiconductor chip 64a, when singulated, provides chip 29 including insulating layer 42/82 coupled to chip 29 opposite of active area 48/68.

Figure 10:
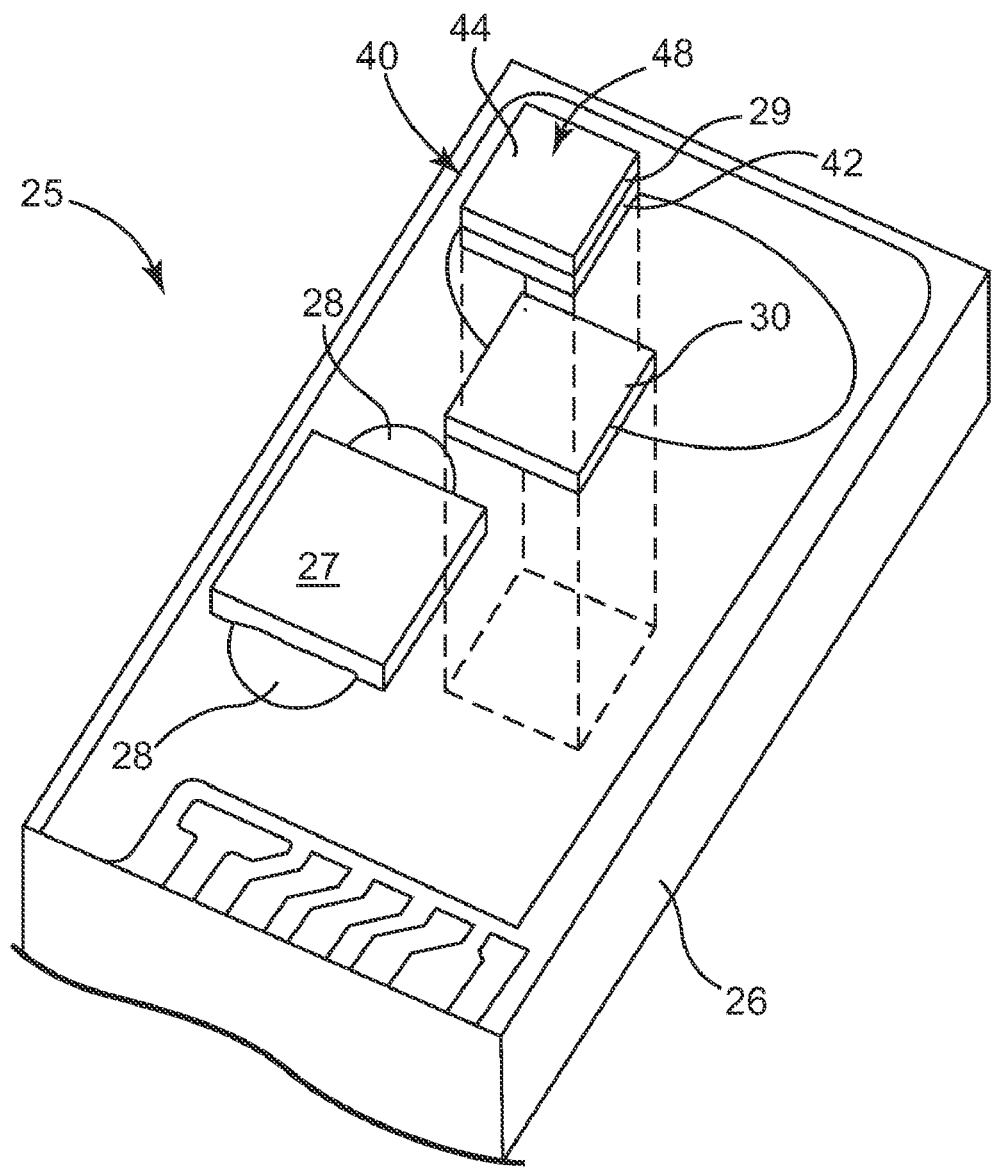
FIG. 10 is a perspective view of a first chip electrically connected to a die pad and an exploded view of a second chip configured to be bonded to the die pad and electrically isolated from the first chip and the die pad according to one embodiment.

FIG. 10 is a perspective view of die package 25 including semiconductor device 40 ready for attachment to carrier 26 according to one embodiment. Semiconductor device 40 is illustrated in an exploded view in which adhesion layer 30 is positioned for attachment to carrier 26, and semiconductor chip 29 is positioned for attachment to adhesion layer 30 and carrier 26. With reference to FIG. 6, insulating layer 42 is in contact with second face 46 of semiconductor chip 29. When semiconductor device 40 is attached to carrier 26, first face 44 is oriented away from carrier 26 and second face 46 is oriented toward carrier 26.

In one embodiment, adhesion layer 30 is deposited on carrier 26 prior to attaching chip 29. In another embodiment, chip 29 is first attached to adhesion layer 30, and adhesion layer 30 and chip 29 is then attached to carrier 26. In one embodiment, insulating layer 42 has an area that is substantially equal to the area of semiconductor chip 29, and adhesion layer 30 has an area that is greater than an area of insulating layer 42 and/or semiconductor chip 29, as illustrated in FIGS. 5 and 10.

Figure 11:
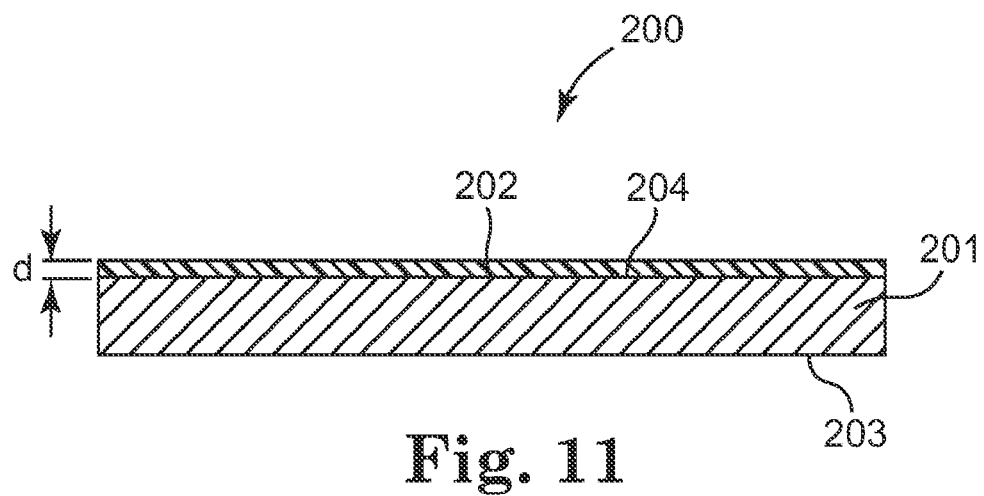
FIG. 11 is a cross-sectional view of a semiconductor device including an isolation layer according to another embodiment.

FIG. 11 is a cross-sectional view of a semiconductor device 200 including an isolation layer 202 according to another embodiment. Semiconductor device 200 includes a wafer 201 having an active front side 203, a passive rear side 204, and an isolation layer 202 deposited on passive rear side 204. In one embodiment, electrically insulating isolation layer 202 is applied to an entire portion of wafer 201 back side 204. Isolation layer 202 is a highly electrically insulating layer that protects against large voltage potentials between semiconductor device 200 and a carrier to which it is attached. In one embodiment, isolation layer 202 is configured to provide semiconductor device 200 with a breakthrough strength of about 250 volts/micrometer.

In one embodiment, isolation layer 202 is applied to the passive rear side 204 (e.g., back side) of wafer 201 to have a thickness d of between about 100 nm to 5 micrometers in a suitable vapor deposition process. Suitable vapor deposition processes for depositing isolation layer 202 onto wafer 201 include plasma vapor deposition, chemical vapor deposition, plasma activated vapor deposition, plasma enhanced vapor deposition, etc.

In one embodiment, isolation layer 202 includes a precursor molecule of C:H:Si:O including about 45-60 atomic weight percent carbon, 15-20 atomic weight percent hydrogen, 15-20 atomic weight percent silicon, and about 10-15 atomic weight percent oxygen. In one embodiment, the precursor molecule is an amorphous carbon molecule including the precursor chemistry described above and is suited for plasma enhanced chemical vapor deposition onto the passive rear side 4 of wafer 201 at relatively low temperatures of less than about 200 degrees Celsius.

In one embodiment, the coefficient of thermal expansion (CTE) of isolation layer 202 is selected to closely match the CTE of the silicon substrate of wafer 201. For example, in one embodiment isolation layer 202 includes a CTE of between about $1-10 \times 10^{-6}$/K, preferably between about $2-3 \times 10^{-6}$/K. In one embodiment, isolation layer configures semiconductor device 200 to have a temperature stability of greater than 450 degrees Celsius.

In one embodiment, the carbon-based precursor is generally a hard layer applied to wafer 201 back side 204 that is selected such that the precursor molecule reacts in the gas phase to be absorbed onto the passive rear side 204 of substrate 201. In this manner, a relatively low temperature deposition (less than 200° C.) of a hard isolation layer is deposited onto wafer 201 to configure semiconductor device to include an electrical insulation layer with a breakthrough strength of about 250 volts/micrometer.

In one embodiment, isolation layer 202 includes a diamond-like carbon (DLC) layer having a high dielectric constant (k). In this specification, the term diamond-like carbon (DLC) means any one of the seven forms of amorphous carbon material having an $sp^3$ lattice structure, or a modified $sp^3$ lattice structure including an $sp^2$ lattice portion of carbon bonds, that displays some of the physical properties of natural diamond. DLC is not synthetic diamond.

Suitable DLC for isolation layer 202 include hydrogen-free amorphous carbon, tetrahedral hydrogen-free amorphous carbon, metal-containing hydrogen-free amorphous carbon, hydrogenated amorphous carbon, tetrahedral hydrogenated amorphous carbon, metal-containing hydrogenated amorphous carbon, and modified hydrogenated amorphous carbon. DLC in its "pure" form includes a lattice structure having an $sp^3$ predominating C—C bond type termed tetrahedral amorphous carbon (ta-C). The tetrahedral amorphous carbon form of DLC has an internal compressive stress related to the $sp^3$ C—C bond type that results in the ta-C form of DLC having a hardness measured by indentation methods to be harder than natural diamond. Embodiments of isolation layer 202 fabricated from ta-C form of DLC are uniquely hard and well suited as an electrical insulting layer. In other embodiments, the super hard tetrahedral amorphous carbon DLC can be modified with diluents of hydrogen, $sp^2$ C—C bond types, carbon, silicon, oxygen, fluorine. In one embodiment, the DLC is defined by a carbon-hydrogen bond and the diluent is defined by X, such that the modified carbon material is defined by C:H:X bonds.

In one embodiment, isolation layer 202 formed of DLC is applied to the passive rear side 204 (e.g., back side) of wafer 201 in a plasma enhanced chemical vapor deposition process to have a thickness d of between about 100 nm to 5 micrometers and a CTE of about $1-2 \times 10^{-6}$/k.

Figure 12:
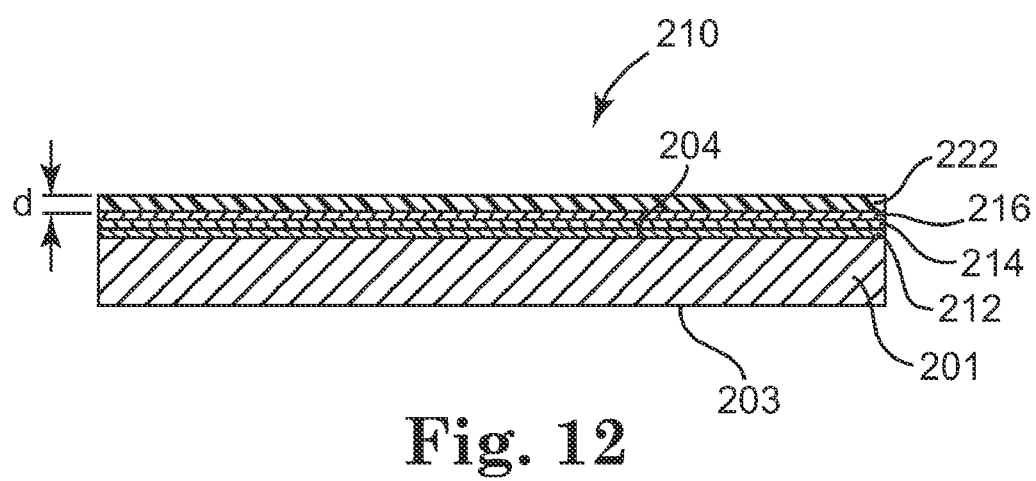
FIG. 12 is a cross-sectional view of another semiconductor device including an adhesion layer and an insulating layer according to another embodiment.

FIG. 12 is a cross-sectional view of a semiconductor device 210 including adhesion layers 212, 214, 216 and an isolation layer 222 according to another embodiment. Isolation layer 222 is deposited over a back side 204 of wafer 201. In this regard, the silicon wafer 201 is substantially similar to the wafer 201 described in FIG. 11 and includes an active front face 203 opposite a passive rear face 204.

In one embodiment, one or more metal layers are deposited onto the passive rear face 204 of wafer 201 to promote adhesion between isolation layer 222 and wafer 201. In one embodiment, a first metal layer 212 is deposited onto the passive rear face 204 of wafer 201, a second metallic adhesion promoter 214 is deposited onto first metal layer 212, a third metallic layer 216 is deposited onto metallic adhesion promoter 214, and isolation layer 222 is deposited onto third metallic layer 216.

In one embodiment, first metallic layer 212 is an aluminium layer (Al) that is deposited onto the passive rear face 204 of wafer 201. Aluminium generally provides good adhesion to silicon. In one embodiment, metallic layer 214 is a titanium material (Ti) that is configured to be an adhesive promoter between aluminium 212 and third metallic layer 216. In one embodiment, third metallic layer 216 is a nickel (Ni) that is adhered to the aluminium layer 212 by the adhesive promoter titanium 214. In one embodiment, metal layers 212-216 are deposited sequentially onto the passive rear surface 204 of wafer 201 in a plasma enhanced chemical vapor deposition process and isolation layer 222 is a carbon-based precursor molecule (such as the C:H:Si:O molecule described above) is deposited in a gas phase onto metallic layer 216.

In one embodiment, isolation layer 222 is a DLC layer, described above, that is applied to the passive rear face 204 (e.g., back side) of wafer 201 in a plasma enhanced chemical vapor deposition process to have a thickness d of between about 100 nm to 5 micrometers and a CTE of about $1 \times 10^{-6}$/k.

The embodiments described in FIGS. 11 and 12 are configured to be singulated into semiconductor chips in a manner that is similar to the singulation process described above for FIG. 3. In addition, after the semiconductor chips are singulated, the uncoated side edges 7 of the semiconductor chip may include a subsequent isolation layer coating in a manner that is similar to that shown in FIG. 3. All embodiments described herein are configured to provide an isolation layer suited for insulating a semiconductor chip from a carrier to which the chip is attached in a manner similar to that shown in FIGS. 4-6 and FIG. 10.

Embodiments provide for electrically isolating a chip from a carrier to which the chip is attached. The electrical isolation is provided at the wafer-level wafer during processing of the wafer.

Embodiments provide an isolation layer on a chip that is de-coupled from the adhesion layer employed to attach the chip to the carrier. To this end, the isolation layer electrically isolates the chip, and the adhesion layer bonds the electrically isolated chip to the carrier. In contrast, the known electrically isolated chips rely upon a single tape or epoxy layer to provide both the adhesion and the electrical isolation.

Thus, de-coupling the isolation layer from the adhesion layer minimizes or eliminates the risk of solder/epoxy undesirably splashing when the chips are insulatively glued to a carrier. In addition, de-coupling the isolation layer from the adhesion layer minimizes or eliminates the risk of air entrapment in the insulative glue or tape, which can lead to voids in the bonding material causing a breakdown in the isolation of the chip.

Isolation layers described above are configured to electrically isolate semiconductor chips, such as control chips, from the conducting island of a leadframe to which they are attached. The isolation layer provides the electrical insulation for the chip, and the adhesion layer provides the bonding material between the chip and the carrier. The isolated chip is configured to withstand a minimum blocking voltage from the carrier in the range of about 50 volts to 1,000 volts.

Isolation layers applied at the wafer level that configure singulated semiconductor chips use in high voltage potential settings include layers fabricated from Parylene including Parylene C, Parylene N, or Parylene D, carbon precursor molecules including C:H:Si:O, diamond-like carbon, oxides, silicon dioxide, nitrides, silica, borosilicate glass.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of a semiconductor device having one chip electrically isolated from another chip and the carrier to which the chips are attached. Therefore, it is intended that this invention be limited only by the claims and the equivalents thereof.

What is claimed is:

1. A semiconductor device comprising:
    a carrier;
    a semiconductor chip including an active area on a first face and a separate isolation layer on an opposing second face, the isolation layer comprising a Parylene layer; and
    an adhesion material coupling the isolation layer to the carrier with the second face facing the carrier.

2. The semiconductor device of claim 1, wherein the carrier comprises a leadframe including one of a quad flat, a dual small outline, and a thin shrink small outline package.

3. The semiconductor device of claim 1, wherein the carrier comprises a leadless package including one of a quad flat no-lead package and a thin small leadless package.

4. The semiconductor device of claim 1, further comprising:
    a power chip coupled to the carrier; and
    wherein the semiconductor chip comprises a control chip and the adhesion material couples an entirety of the isolation layer of the control chip to the carrier, the power chip maintained at a voltage potential relative to the control chip and electrically connected to a contact of the control chip by a connector.

5. The semiconductor device of claim 1, wherein Si—O—Si bonds couple the isolation layer to the second face of the semiconductor chip.

6. The semiconductor device of claim 1, wherein an adhesion layer is disposed between the second face of the chip and the isolation layer, the adhesion layer including an aluminum layer disposed on the second face, a titanium layer disposed on the aluminum layer, and a nickel layer disposed between the titanium layer and the isolation layer.

7. A semiconductor device comprising:
    a carrier;
    a power chip coupled to the carrier;
    a semiconductor chip including a substrate surface, a first surface separated from the substrate surface and including an active area, and an insulating layer applied to the substrate surface, the insulating layer comprising a Parylene layer;
    an adhesion layer coupling the insulating layer of the semiconductor chip to the carrier; and
    wherein the power chip is configured to be maintained at a voltage potential relative to the semiconductor chip and is electrically connected to a contact of the semiconductor chip by a connector.

8. The semiconductor device of claim 7, wherein the substrate surface is oriented toward the carrier and the active area of the first surface is oriented away from the carrier.

9. The semiconductor device of claim 7, wherein an area of the first surface is substantially equal to an area of the insulating layer, and an area of the adhesion layer is greater than the area of the first surface and greater than the area of the insulating layer.

10. The semiconductor device of claim 7, wherein the insulating layer is applied to the substrate surface on a wafer level and is configured to electrically isolate the semiconductor chip from the carrier for drain potentials of between about 50-1000 volts.

11. A chip-by-chip die package comprising:
    a conductive die pad;
    a first chip electrically connected to the die pad;
    a second chip bonded to the die pad by a bond layer, the second chip including an active surface, a substrate surface opposite the active surface, and an isolation layer coupled to the substrate surface, the isolation layer comprising a Parylene layer; and
    wherein the isolation layer is disposed between the substrate surface of the second chip and the bond layer and is configured to electrically isolate the second chip from the die pad and the first chip.

12. The chip-by-chip die package of claim 11, wherein the substrate surface of the second chip and the isolation layer coupled to the substrate surface comprise substantially the same area.

13. A semiconductor device comprising:
    an electrically conductive carrier;
    a semiconductor chip including an active area on a first face and having an opposing passive second face;
    a glass isolation layer coupled to the second face of the semiconductor chip with Si—O—Si bonds at an interface between the glass isolation layer and the second face of the semiconductor chip; and
    an adhesion material coupling the glass isolation layer to the carrier, wherein the glass isolation layer electrically isolates the semiconductor chip from the carrier.

14. The semiconductor device of claim 13, including an adhesion layer is disposed between the second face of the chip and the isolation layer, the adhesion layer including an aluminum layer disposed on the second face, a titanium layer disposed on the aluminum layer, and a nickel layer disposed between the titanium layer and the isolation layer.

* * * * *